(12) United States Patent
Wang et al.

(10) Patent No.: US 8,334,160 B2
(45) Date of Patent: Dec. 18, 2012

(54) SEMICONDUCTOR PHOTOVOLTAIC DEVICES AND METHODS OF MANUFACTURING THE SAME

(75) Inventors: Brite Jui-Hsien Wang, Hsinchu (TW); Naejye Hwang, Hsinchu (TW); Zingway Pei, Taichung (TW)

(73) Assignee: Lof Solar Corporation, Hsinchu (TW)

( * ) Notice: Subject to any disclaimer, the term of this patent is extended or adjusted under 35 U.S.C. 154(b) by 673 days.

(21) Appl. No.: 11/865,600

(22) Filed: Oct. 1, 2007

(65) Prior Publication Data
US 2009/0084440 A1    Apr. 2, 2009

(51) Int. Cl.
 *H01L 21/00* (2006.01)

(52) U.S. Cl. ............ 438/57; 438/434; 257/61; 257/371; 257/519

(58) Field of Classification Search ............ 438/57, 438/434; 257/61, 371, 519
See application file for complete search history.

(56) References Cited

U.S. PATENT DOCUMENTS

| | | | |
|---|---|---|---|
| 3,969,746 A * | 7/1976 | Kendall et al. | 136/255 |
| 4,101,351 A * | 7/1978 | Shah et al. | 438/72 |
| 4,306,951 A * | 12/1981 | Depp et al. | 417/413.3 |
| 4,726,850 A | 2/1988 | Wenham et al. | |
| 5,053,083 A * | 10/1991 | Sinton | 136/256 |
| 5,258,077 A | 11/1993 | Shahryar | |
| 5,541,425 A * | 7/1996 | Nishihara | 257/139 |
| 6,084,175 A * | 7/2000 | Perry et al. | 136/256 |
| 6,534,365 B2 * | 3/2003 | Kim et al. | 438/270 |
| 6,660,591 B2 * | 12/2003 | Peake et al. | 438/270 |
| 6,663,944 B2 | 12/2003 | Park et al. | |
| 6,781,194 B2 * | 8/2004 | Baliga | 257/327 |
| 7,264,982 B2 * | 9/2007 | Cheng et al. | 438/48 |
| 7,741,172 B2 * | 6/2010 | Wilson et al. | 438/237 |
| 7,936,034 B2 * | 5/2011 | Rothman | 257/438 |
| 2002/0167046 A1 * | 11/2002 | Aoki et al. | 257/330 |
| 2006/0097313 A1 * | 5/2006 | Yanagisawa et al. | 257/329 |

OTHER PUBLICATIONS

Wenham et al., "Simplified Buried Contact Solar Cell Process", 25th PVSC, May 13-17, 1996, Washington, D.C., U.S.

* cited by examiner

*Primary Examiner* — Jarrett Stark
*Assistant Examiner* — Nicholas Tobergte
(74) *Attorney, Agent, or Firm* — Finnegan, Henderson, Farabow, Garrett & Dunner, LLP

(57) ABSTRACT

A semiconductor photovoltaic device comprises a semiconductor substrate having a first surface and a second surface, the first surface and the second surface being opposed to each other, a plurality of trenches extending into the semiconductor substrate from the first surface, the first surface being a substantially planar surface, a dopant region in the semiconductor substrate near the first surface and the plurality of trenches, a first conductive layer over the semiconductor substrate, and a second conductive layer on the second surface of the semiconductor substrate.

5 Claims, 14 Drawing Sheets

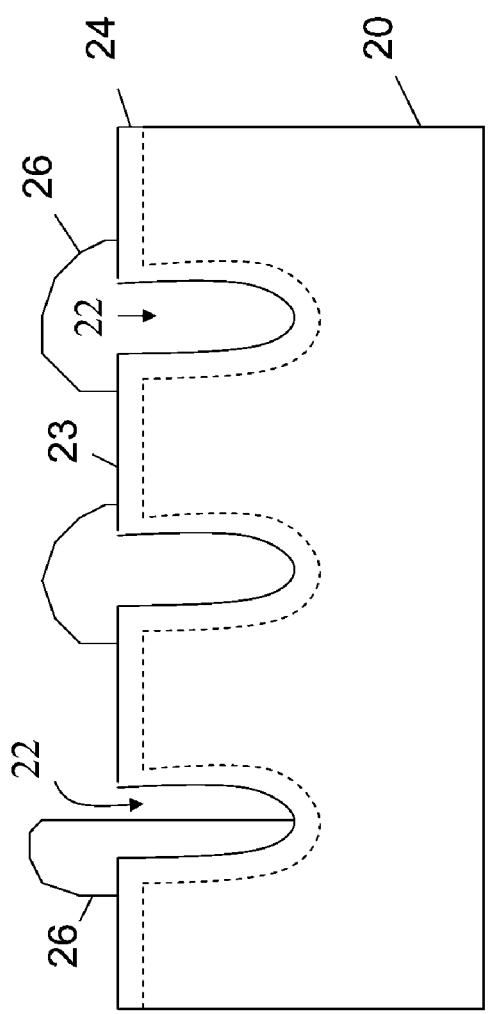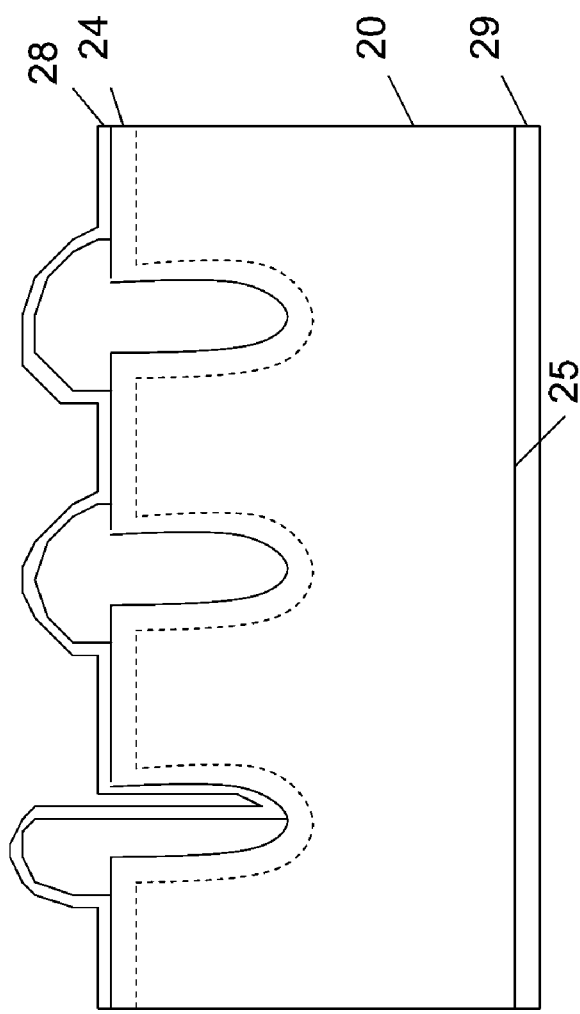

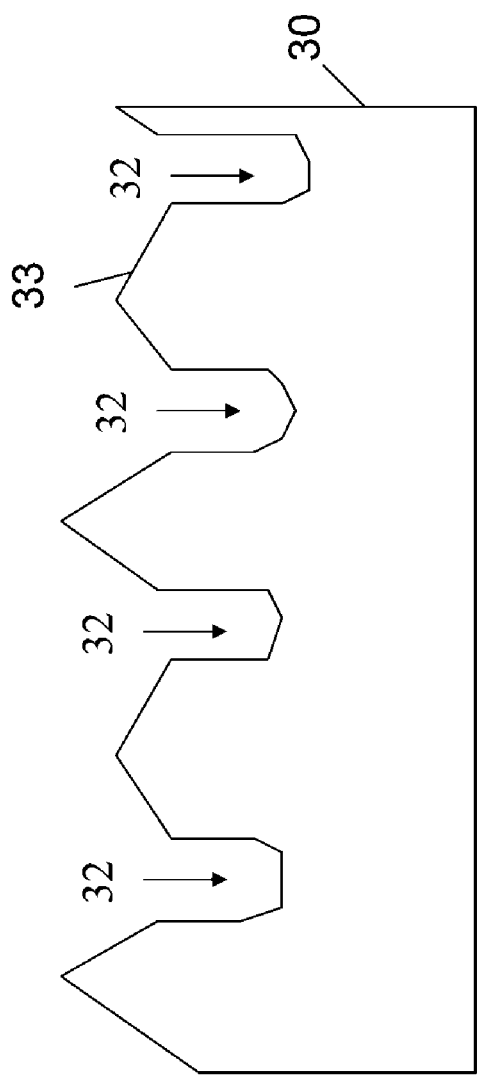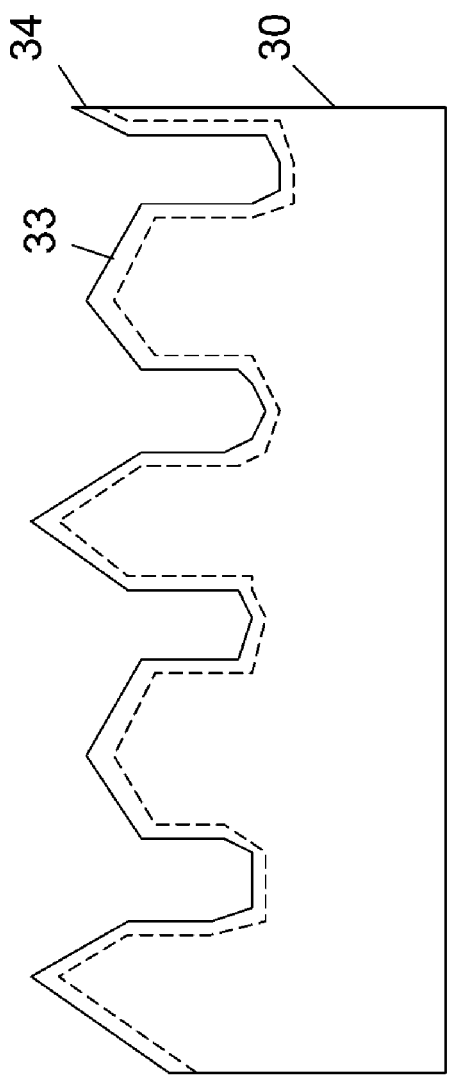

SEMICONDUCTOR PHOTOVOLTAIC DEVICES AND METHODS OF MANUFACTURING THE SAME

BACKGROUND OF THE INVENTION

The present invention relates generally to a photovoltaic device, and more particularly, to a semiconductor photovoltaic device and a method of fabricating the same.

Due to limited resources on the earth and increasing demand for energy, interest in developing energy sources is rapidly growing. Solar energy is one of the most important energy sources that have become available in recent years. A great deal of attention has been paid to photovoltaic devices such as solar cells, which are capable of converting solar energy into electrical energy. Solar cells may be fabricated on semiconductor wafers such as silicon (Si) wafers. In general, a semiconductor solar cell may include a p-n junction between a p-type semiconductor and an n-type semiconductor. In the solar cell, electron-hole pairs are energized by photon. The generated electrons and holes may respectively move toward the p-type and n-type semiconductors, and then accumulate in separate contacts. When light is incident on the solar cell, an electrical current may be generated and an electrical voltage may be established.

Conversion efficiency, which is generally represented as a ratio of electric output of a solar cell to an amount of incident light, may be an important index of the performance of solar cells. Generally, the higher the conversion efficiency, the less conversion loss from solar energy to electric energy. Accordingly, it may be desirable to have a semiconductor photovoltaic device that has relatively high conversion efficiency. It may also be desirable to have a method of manufacturing semiconductor photovoltaic devices having relatively high conversion efficiency.

BRIEF SUMMARY OF THE INVENTION

The present invention is directed to a semiconductor photovoltaic device and a method of manufacturing the same that may achieve relatively high conversion efficiency.

In accordance with an example of the present invention, there is provided a semiconductor photovoltaic device that comprises a semiconductor substrate having a first surface and a second surface, the first surface and the second surface being opposed to each other, a plurality of trenches extending into the semiconductor substrate from the first surface, the first surface being a substantially planar surface, a dopant region in the semiconductor substrate near the first surface and the plurality of trenches, a first conductive layer over the semiconductor substrate, and a second conductive layer on the second surface of the semiconductor substrate.

Also in accordance with an example of the present invention, there is provided a semiconductor photovoltaic device that comprises a semiconductor substrate, a textured structure over the semiconductor substrate, the textured structure including a plurality of pyramids, a plurality of trenches extending into the semiconductor substrate, each the trenches being between at least two adjacent pyramids of the plurality of pyramids, a dopant region in the semiconductor substrate near the plurality of trenches, a first conductive layer over the textured structure, and a second conductive layer under the semiconductor substrate.

Further in accordance with an example of the present invention, there is provided a method of manufacturing a semiconductor photovoltaic device, the method comprising providing a semiconductor substrate having a first surface and a second surface, the first surface and the second surface being opposed to each other, etching the semiconductor substrate to form a plurality of trenches into the semiconductor substrate, forming a dopant region in the semiconductor substrate near the first surface and the plurality of trenches, forming a first conductive layer over the semiconductor substrate, and forming a second conductive layer on the second surface of the semiconductor substrate.

Still in accordance with an example of the present invention, there is provided a method of manufacturing a semiconductor photovoltaic device, the method comprising providing a semiconductor substrate, forming a textured structure over the semiconductor substrate, the textured structure including a plurality of pyramids, etching the textured structure to form a plurality of trenches into the semiconductor substrate, each the trenches being between at least two adjacent pyramids of the plurality of pyramids, forming a dopant region in the textured semiconductor substrate near the plurality of trenches, forming a first conductive layer over the textured structure, and forming a second conductive layer under the textured semiconductor substrate.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 2A and 2B are cross-sectional diagrams illustrating a method of fabricating a semiconductor photovoltaic device in accordance with another example of the present invention;

FIGS. 3A to 3F are cross-sectional diagrams illustrating a method of fabricating a semiconductor photovoltaic device in accordance with yet another example of the present invention;

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like portions.

Figure 1A:
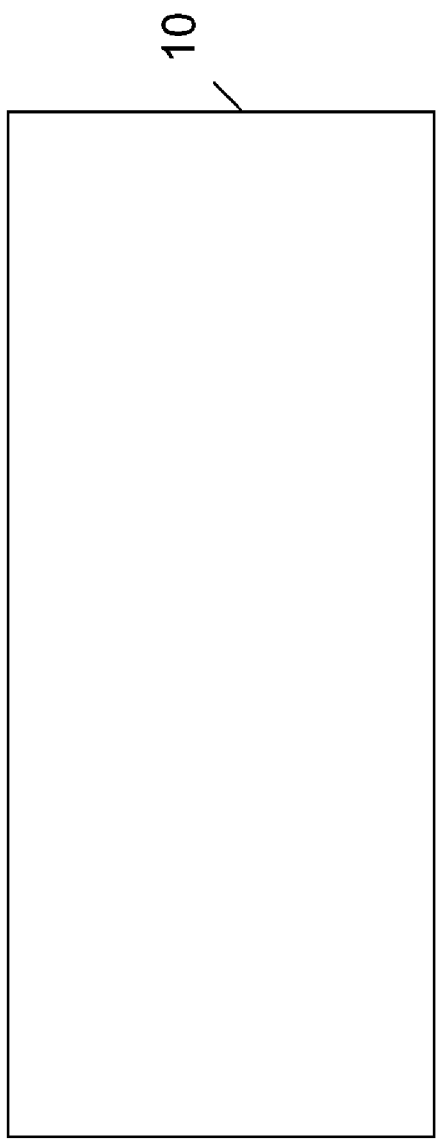
FIGS. 1A to 1F are cross-sectional diagrams illustrating a method of fabricating a semiconductor photovoltaic device in accordance with an example of the present invention.

FIGS. 1A to 1F are cross-sectional diagrams illustrating a method of fabricating a semiconductor photovoltaic device in accordance with an example of the present invention. Referring to FIG. 1A, a substrate 10, which may comprise p-type impurities, is provided. In one example, the substrate 10 may include one of a silicon wafer, a gallium arsenide (GaAs) wafer and a zinc phosphide (ZnP) wafer. The resistivity ($\rho$) of the substrate 10 may range from approximately 0.01 to 20 ohms-centimeter ($\Omega$-cm) but the range may vary in other applications. Furthermore, the substrate 10 may have a thickness ranging from approximately 180 to 230 micrometers ($\mu$m) but may be thinner or thicker.

Figure 1B:
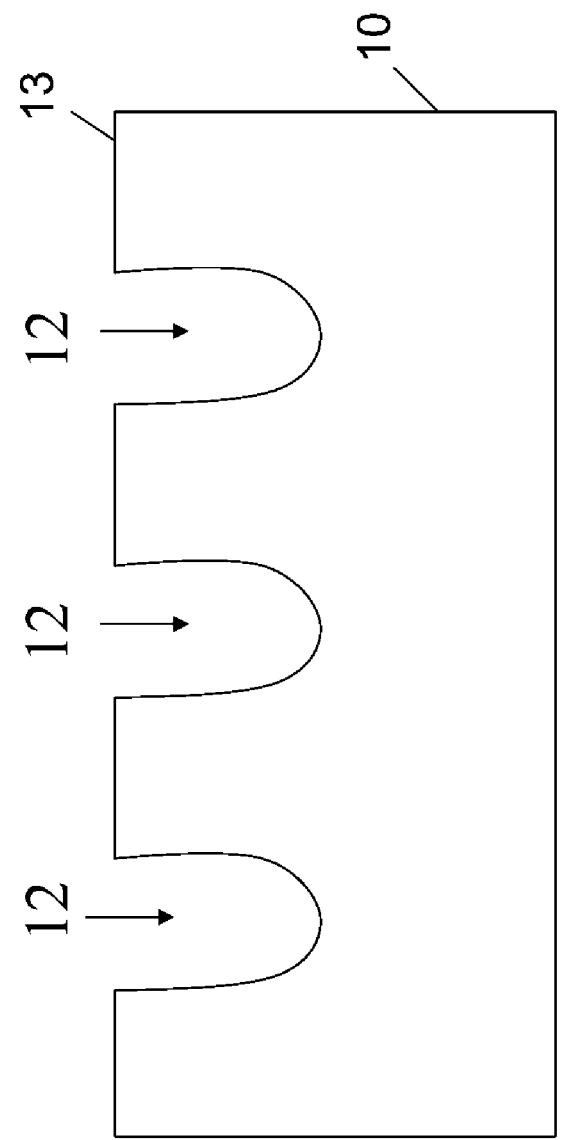

Referring to FIG. 1B, a plurality of trenches 12 may be formed into the substrate 10 from a first surface 13 thereof. The first surface 13 of the substrate 12 may be a plane surface. The trenches 12 may be formed by a wet etching process such as an electrochemical etching (ECE) process. In one example, suitable etching solution for the ECE process may include phosphoric acid such as one of hydrogen fluoride (HF), dimethylformamide (DMF), a mixture of HF and deionized water ($H_2O$), a mixture of DMF and $H_2O$, a mixture of HF and ethanol ($C_2H_5OH$) and a mixture of HF, DMF and $H_2O$. Furthermore, the trenches 12 may be formed by a dry etching process with the help of a mask. The width of each of the trenches 12 may range from approximately 0.1 to 10 $\mu$m and the distance between immediately adjacent trenches 12 may range from approximately 0.1 to 100 $\mu$m. Moreover, the depth of each of the trenches 12 from the first surface 13 of the substrate 10 may range from approximately 0.1 to 200 $\mu$m.

Figure 1C:
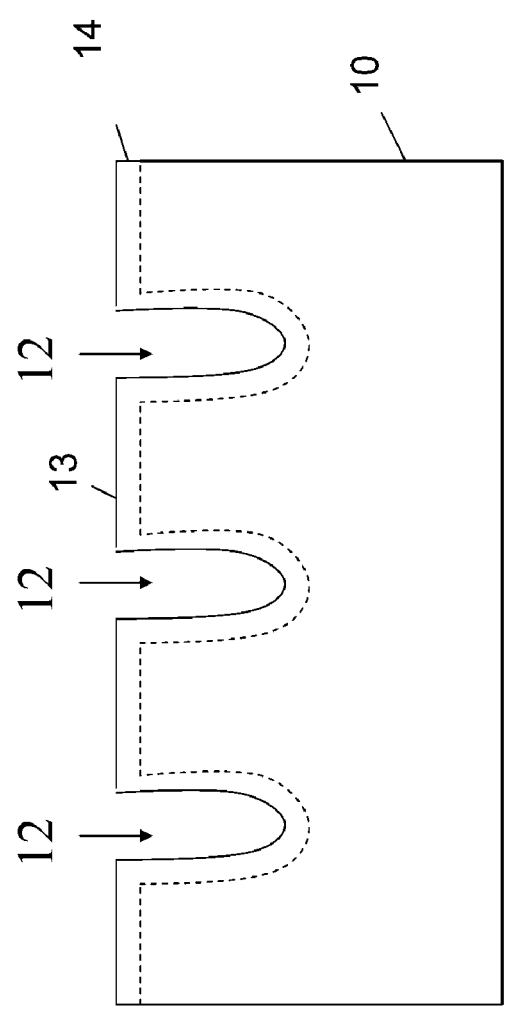
Figure 1D:
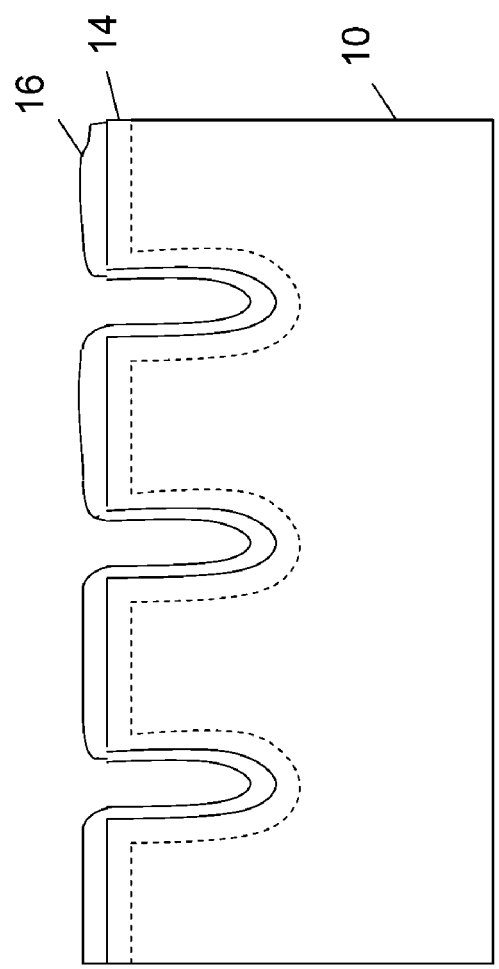
Figure 1E:
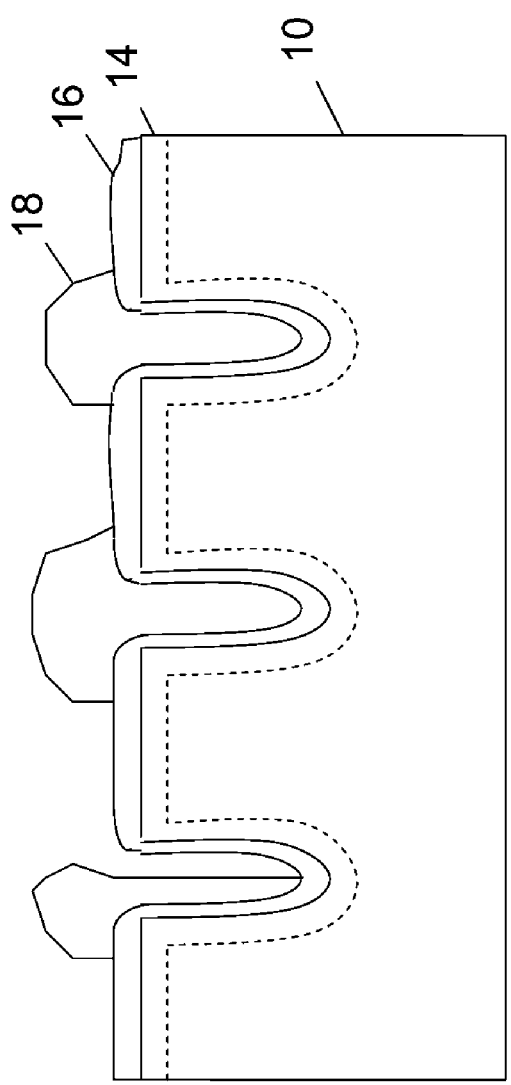
Figure 1F:
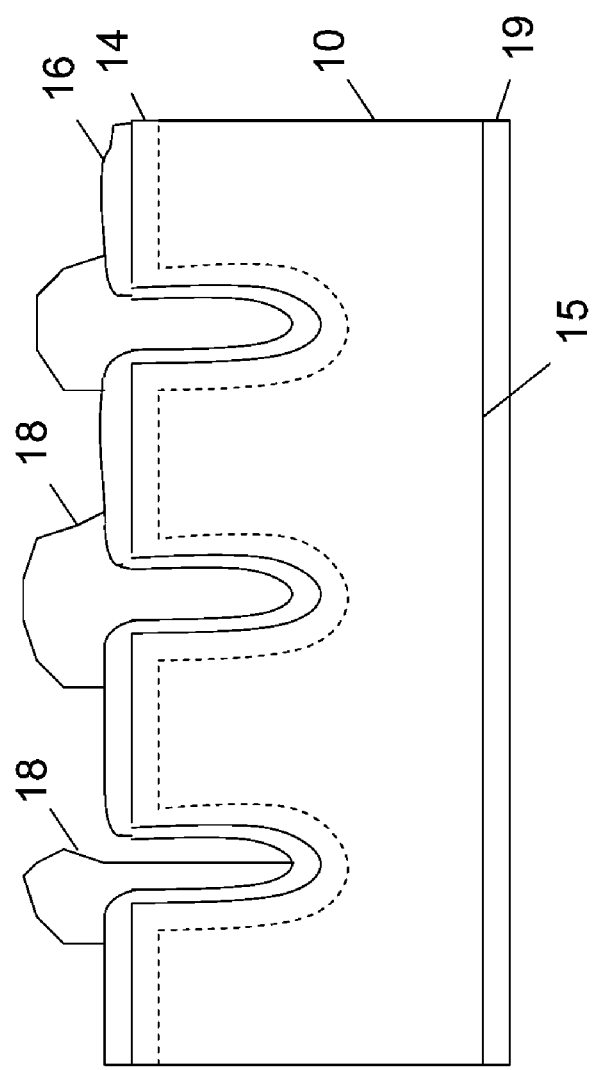
Figure 1H:
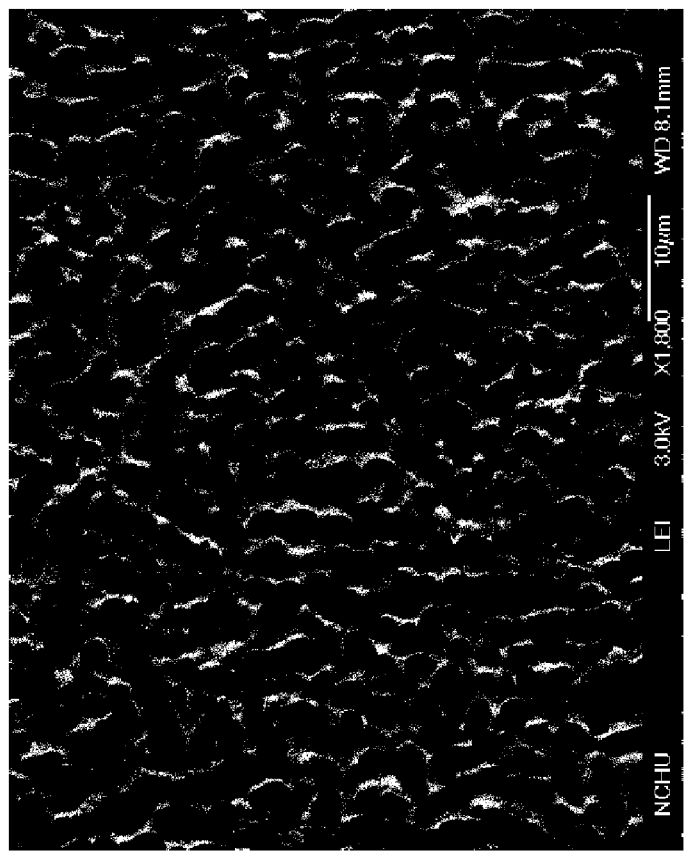
FIGS. 1G and 1H are exemplary scanning electron microscope (SEM) photos showing respectively a cross-sectional view and a top planar view of the trenches illustrated in FIG. 1B.
Figure 1G:
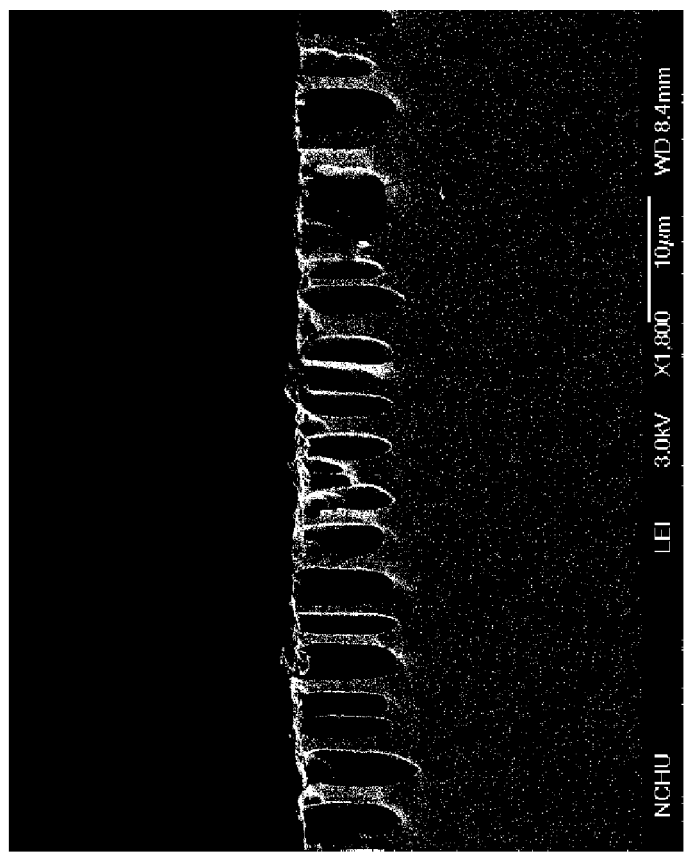

FIGS. 1G and 1H are exemplary scanning electron microscope (SEM) photos showing respectively a cross-sectional view and a top planar view of the trenches 12 illustrated in FIG. 1B Referring to FIG. 1G, each of the trenches 12 may have a steep-sided profile. Specifically, in one example, each of the trenches 12 may include a steep or vertical sidewall 12-1. Referring to FIG. 1H, the plurality of trenches 12 may be randomly distributed over the substrate 10.

Referring to FIG. 1C, a dopant region 14 may be formed near the first surface 13 and the surfaces of the plurality of trenches 12 by, for example, one of a diffusion, epitaxy and implantation process or another suitable process. In one example, the dopant region 14 may be heavily doped with n-type impurities by a diffusion process using phosphorus oxychloride ($POCl_3$) gas at a temperature of approximately 840 degrees Celsius (° C.) for approximately twenty minutes. The concentration of the n-type impurities may be approximately $10^{18}$ cm$^{-3}$. Furthermore, the thickness of the dopant region 14 from the first surface 13 and the surfaces (not numbered) of the trenches 12 may range from approximately 0.1 to 0.2 $\mu$m but the range may vary in other applications.

Referring to FIG. 1D, a coating layer 16 may be formed over the substrate 10 by a chemical vapor deposition ("CVD") process, a sputtering process or another suitable process. The coating layer 16 may extend conformally over the first surface 13 and the trenches 12. In one example, the coating layer 16 may include anti-reflection material such as one of silicon nitride ($SiN_x$) and silicon oxide such as silicon dioxide ($SiO_2$). Furthermore, the thickness of the coating layer 16 may be approximately 0.08 $\mu$m but could be thinner or thicker.

Referring to FIG. 1E, a first conductive layer 18 may be formed over the substrate 10 by one of a screen printing, electro plating, sputtering and evaporating process or another suitable process. In the present example, the first conductive layer 18, which may subsequently form a first electrode layer for the photovoltaic device, may include a patterned structure comprising one of aluminum (Al) and silver (Ag). In another example, the first conductive layer 18 may include a non-patterned structure comprising one of indium tin oxide (ITO) and indium zinc oxide (IZO). The thickness of the first conductive layer 18 may range from approximately 0.3 to 5 $\mu$m but the range may vary in other applications. Furthermore, some of the trenches 12 may be entirely covered by the first conductive layer 18, while the other of the trenches 12 may be only partially covered.

Referring to FIG. 1F, a second conductive layer 19 may be formed on a second surface 15 of the substrate 10 by one of a screen printing, electro plating, sputtering and evaporating or another suitable process. In one example, the second conductive layer 19 may include one of Al and Ag. The thickness of the second conductive layer 19 may be approximately 0.3 $\mu$m but could be thinner or thicker. Subsequently, an annealing treatment, such as a rapid thermal annealing (RTA) treatment, may be conducted at a temperature ranging from approximately 500° C. to 950° C. for approximately 10 minutes. The second conductive layer 19 may subsequently form a second electrode layer for the photovoltaic device.

FIGS. 2A and 2B are cross-sectional diagrams illustrating a method of fabricating a semiconductor photovoltaic device in accordance with another example of the present invention. Referring to FIG. 2A, a substrate 20, a plurality of trenches 22 and a dopant region 24 may be subsequently formed. The substrate 20, trenches 22 and dopant region 24 may be similar to the substrate 10, trenches 12 and dopant region 14 described and illustrated with reference to FIGS. 1A, 1B and 1C, respectively and need not be further discussed.

A first conductive layer 26 may be formed over the substrate 20 by one of a screen printing, electro plating, sputtering and evaporating process or another suitable process. In one example, the first conductive layer 26, which may subsequently become a first electrode layer for the photovoltaic device, may include one of Al, Ag, ITO and IZO. The thickness of the first conductive layer 26 from a first surface 23 of the substrate 20 may range from approximately 0.3 to 5 mm. Furthermore, some of the trenches 22 may be entirely covered by the first conductive layer 26, while the other of the trenches 22 may be only partially covered.

Referring to FIG. 2B, a coating layer 28 may be formed over the substrate 20 by a CVD process, a sputtering process or another suitable process. The coating layer 28 may extend conformally along the first surface 23 and the first conductive layer 26. In one example, the coating layer 28 may include anti-reflection material such as one of silicon nitride ($SiN_x$)

and silicon dioxide ($SiO_2$). Furthermore, the thickness of the coating layer 28 may be approximately 0.08 μm but could be thinner or thicker.

A second conductive layer 29 may be formed on a second surface 25 of the substrate 20 by one of a screen printing, electro plating, sputtering and evaporating process or another suitable process. The second conductive layer 29 may subsequently become a second electrode layer for the photovoltaic device. The example described and illustrated with reference to FIGS. 2A and 2B may be similar to that with reference to FIGS. 1A to 1F except that, for example, the first conductive layer 26 is formed earlier than the coating layer 28. In other examples, however, the second conductive layer 29 may be formed earlier than the first conductive layer 26 and the coating layer 28.

Figure 3A:
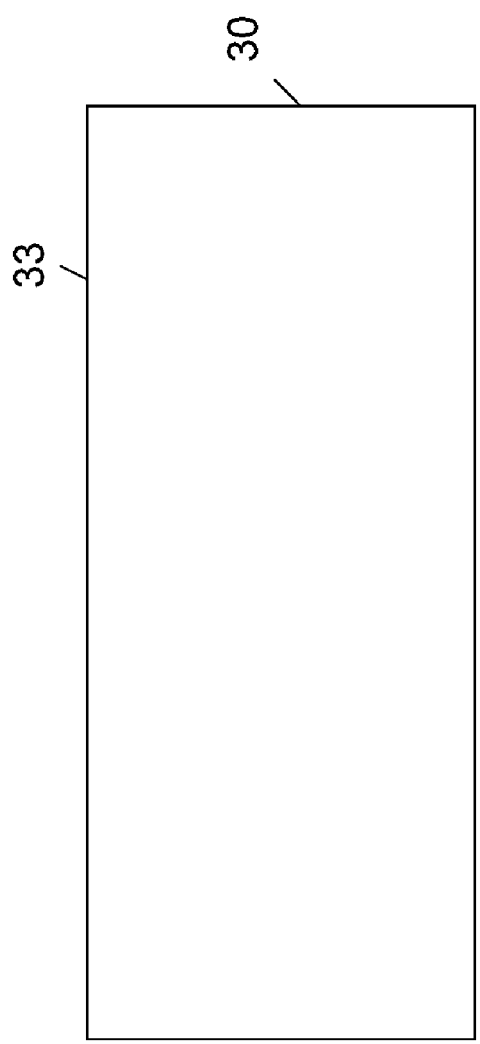
Figure 3B:
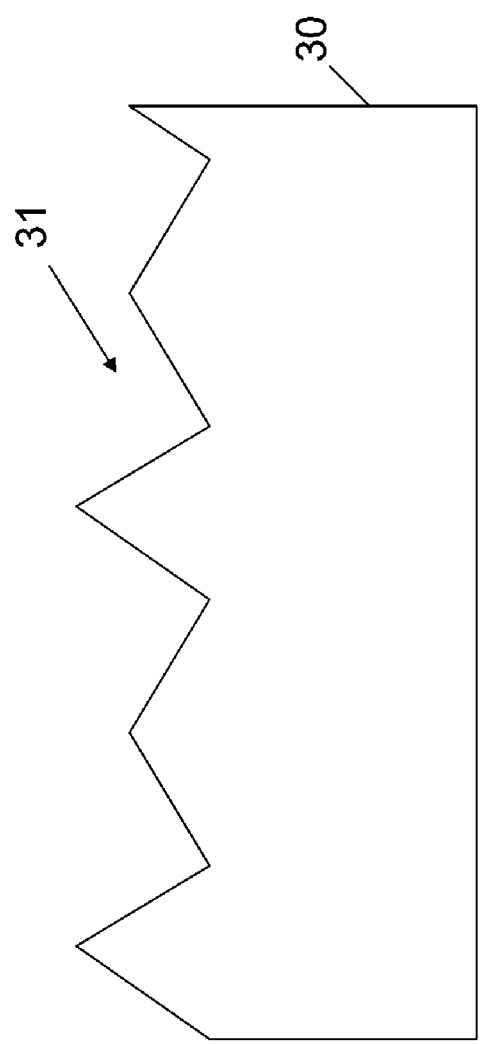

FIGS. 3A to 3F are cross-sectional diagrams illustrating a method of fabricating a semiconductor photovoltaic device in accordance with yet another example of the present invention. Referring to FIG. 3A, a substrate 30, which may be similar to the substrate 10 described and illustrated with reference to FIG. 1A, is provided. Referring to FIG. 3B, a textured structure 31 may be formed by, for example, an etching process. The textured structure 31 in one example may include a plurality of pyramids. The size of the pyramids may range from a smaller base of approximately 5×5 μm$^2$ with a height of approximately 3 to 4 μm to a larger base of approximately 10×10 μm$^2$ with a height of approximately 6 to 7 μm. Furthermore, the etching process may include an anisotropic etching process using, for example, 1.5-mol (1.5 M) KOH solution at a temperature of approximately 80° C. for approximately 20 minutes. The etching speed in the orientation [100] may be faster than that in the orientation [111] during the anisotropic etching process, which may etch the substrate 30 from a first surface 33 thereof.

Referring to FIG. 3C, a plurality of trenches 32 may be formed into the substrate 30. In one example, the trenches 32 may be formed by an ECE process in a way similar to that described and illustrated with reference to FIG. 1B. Furthermore, the size and dimensional parameters of the trenches 32 may be similar to those of the trenches 12 described and illustrated with reference to FIG. 1B.

Referring to FIG. 3D, a dopant region 34 may be formed near the first surface 33 and the surfaces of the plurality of trenches 32. Next, referring to FIG. 3E, a coating layer 36 and a first conductive layer 38 may be formed over the substrate 30. In the present example, the coating layer 36, which may be formed earlier than the first conductive layer 38, may extend conformally over the first surface 33 and the trenches 32. In another example, the coating layer 36, which may be formed later than the first conductive layer 38, may extend over the first surface 33 and the first conductive layer 38. The dopant region 34, coating layer 36 and first conductive layer 38 may be similar in fabricating process and structure to the dopant region 14, coating layer 16 and first conductive layer 18 described and illustrated with reference to FIGS. 1C, 1D and 1E, respectively.

Figures 3E, 3F:
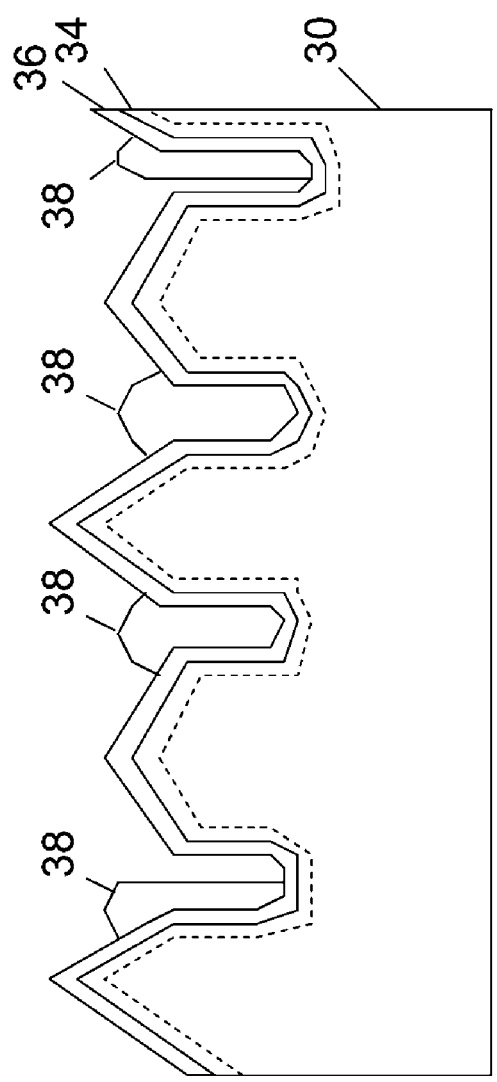

Referring to FIG. 3F, a second conductive layer 39 may be formed on a second surface 35 of the substrate 30. The second conductive layer 39 may be similar in fabricating process and structure to the second conductive layer 19 described and illustrated with reference to FIG. 1F.

Figure 4A:
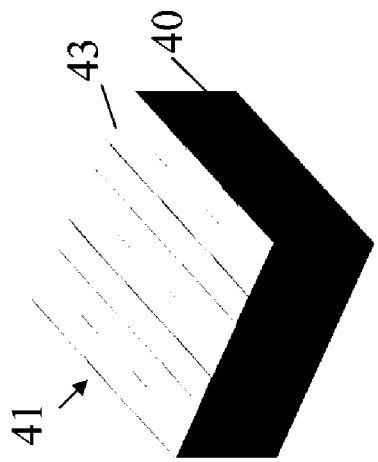
FIGS. 4A to 4G are elevational perspective diagrams illustrating a method of fabricating a semiconductor photovoltaic device in accordance with still another example of the present invention.

FIGS. 4A to 4G are elevational perspective diagrams illustrating a method of fabricating a semiconductor photovoltaic device in accordance with still another example of the present invention. Referring to FIG. 4A, a substrate 40, which may be doped with p-type impurities, is provided. The substrate 40 may be similar in structure and electrical characteristics to the substrate 30 described and illustrated with reference to FIG. 3A.

Figure 4B:
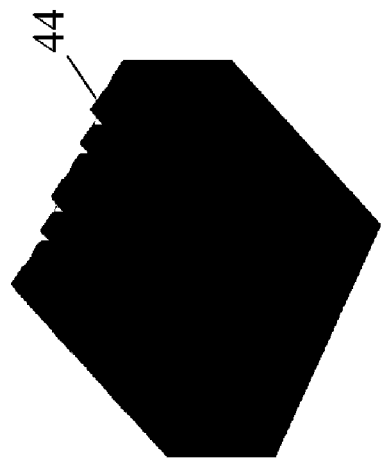
Figure 4C:
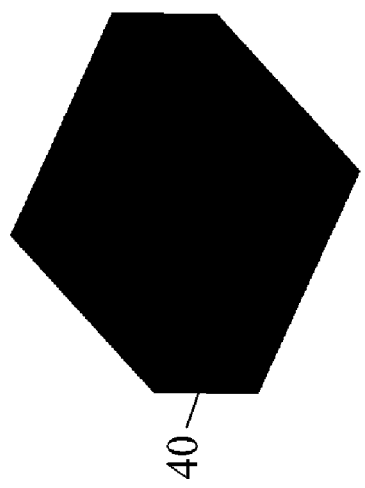

Referring to FIG. 4B, a textured structure 41 in the form of, for example, a plurality of pyramids, may be formed. The textured structure 41 may be similar in fabricating process to the textured structure 31 described and illustrated with reference to FIG. 3B. Next, referring to FIG. 4C, a plurality of trenches 42 may be formed into the substrate 40, which may locate largely between at least two adjacent pyramids of the plurality of pyramids. The trenches 42 may be formed in a process similar to that described and illustrated with reference to FIG. 3C for forming the trenches 32.

Figure 4D:
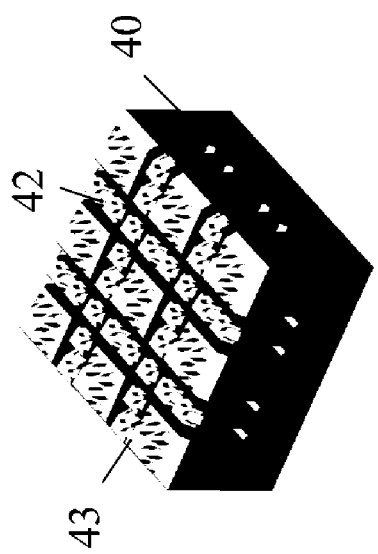

Referring to FIG. 4D, a dopant region 44 may be formed near a first surface 43 of the substrate 40 and the surfaces of the plurality of trenches 42. In one example, the dopant region 44 may be doped with n-type impurities by a diffusion process using $POCl_3$ gas. The dimensional parameters and electrical characteristics of the dopant region 44 may be similar to those of the dopant region 34 described and illustrated with reference to FIG. 3D.

Figure 4E:
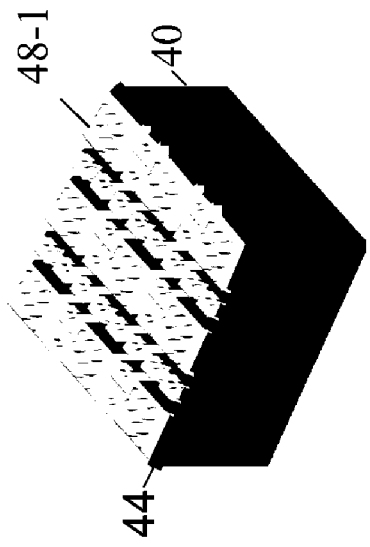

Referring to FIG. 4E, a conductive layer 49 may be formed on a second surface 65 of the substrate 60 by, for example, an evaporating process followed by an annealing process. The annealing process, such as a rapid thermal annealing (RTA) treatment, may be conducted at a temperature of approximately 500° C. for approximately 10 minutes. The conductive layer 49 may subsequently become a second electrode for the photovoltaic device.

Figures 1, 4F:
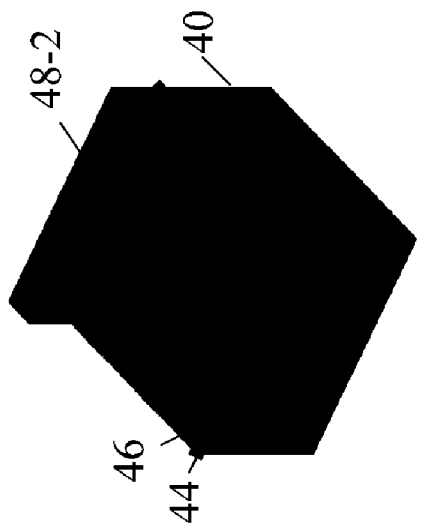
Figures 2, 4F:
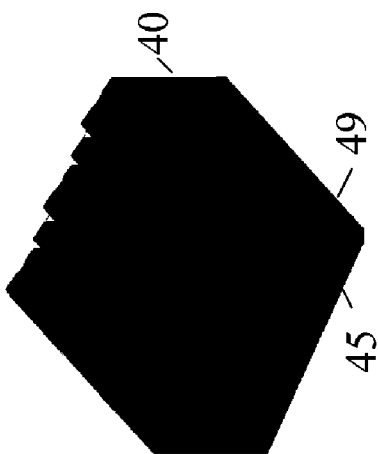

Referring to FIG. 4F-1, another conductive layer 48-1 including a polymeric material such as ITO may be formed over the substrate 40 by, for example, a radio frequency (RF) sputtering process. In one example, the conductive layer 48-1, which may subsequently become a first electrode, may have a thickness of approximately 0.3 μm. Alternatively, referring to FIG. 4F-2, a conductive layer 48-2 including a metallic material such as Al may be formed over the substrate 40 by, for example, an evaporating process. In one example, the conductive layer 48-2 may have a thickness of approximately 1 μm but could be thinner or thicker.

Figure 4G:
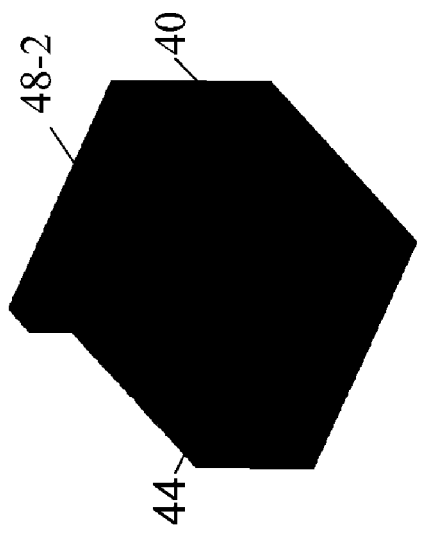

Referring to FIG. 4G, a coating layer 46 may be formed over the substrate 60 by, for example, a plasma-enhanced CVD (PECVD) process. In one example, the coating layer 46 may include anti-reflection material such as $Si_3N_4$. Furthermore, the thickness of the coating layer 46 may be approximately 0.08 μm but could be thinner or thicker. Skilled persons in the art will understand that the steps for forming the conductive layer 49, the conductive layer 48-1 or alternatively 48-2 and the coating layer 46 may be performed in a desired sequential order in particular applications.

Figure 5A:
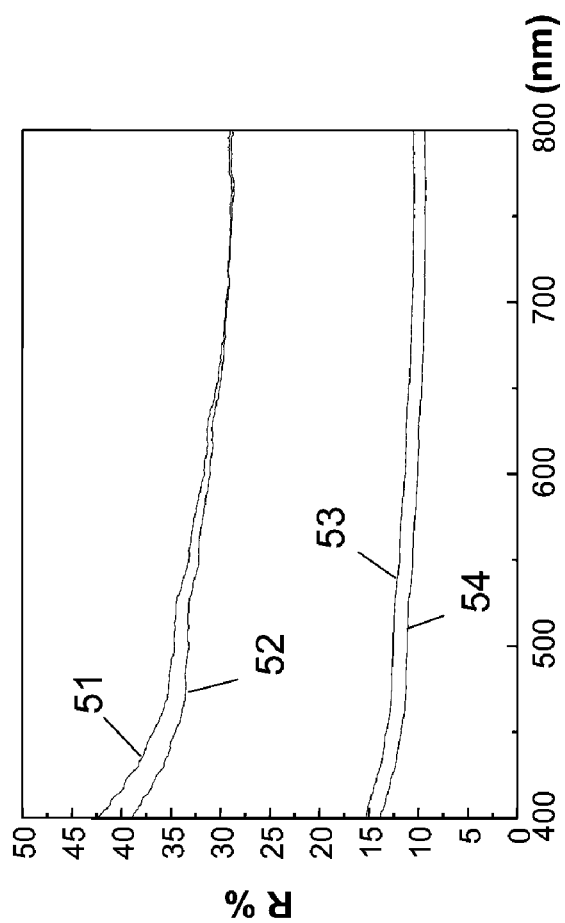
FIGS. 5A and 5B are diagrams illustrating the reflectivity of light incident on the substrate in accordance with various examples of the present invention.
Figure 5B:
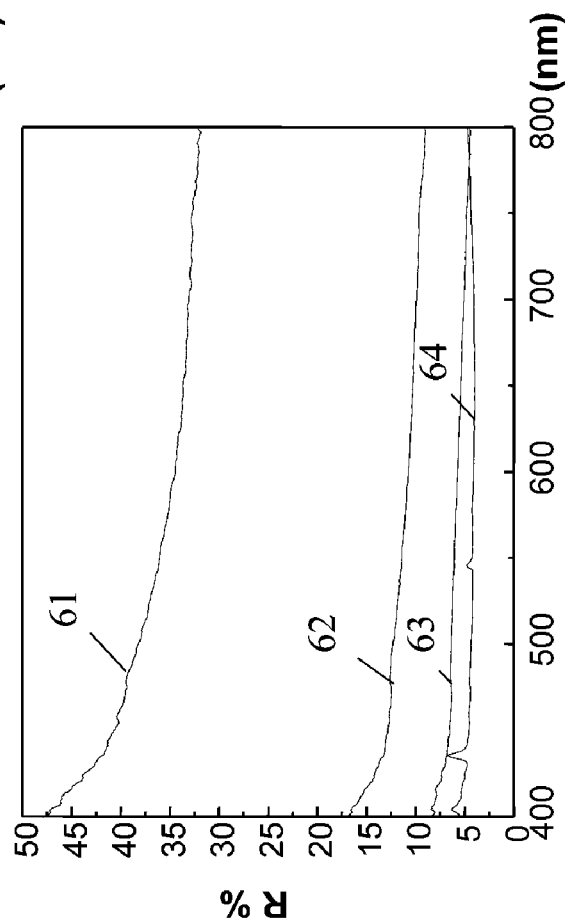

FIGS. 5A and 5B are plots showing experimental results of reflectivity at various wavelengths of an incident light. Referring to FIG. 5A, a first curve 51 may represent the reflectivity of a substrate where no trenches are formed. A second curve 52 may represent the reflectivity of a substrate such as the substrate 10 illustrated in FIG. 1B, where a plurality of trenches are formed based on an ECE etching process using 2M HF as etching solution under application of an electrical current having a current density of approximately 1 milliampere per square centimeter (mA/cm$^2$) for an hour. The trenches thus formed may have a depth of approximately 0.1 μm. Likewise, given the similar etching process, a third curve 53 may represent the reflectivity of a substrate where trench depth may reach 4 μm under a current density of approximately 3 mA/cm$^2$ and a fourth curve 54 may represent the reflectivity of a substrate where trench depth may reach 8 μm under a current density of 5 mA/cm$^2$. The experimental results may reveal that the reflectivity of a substrate may decrease as the trench depth increases, which in turn may result from an increase in the current density. Furthermore, the reflectivity of a substrate having trenches formed therein based on an ECE process may range from approximately 10% to 40% given an incident light having a wavelength of approximately 400 nm to 800 nm.

Referring to FIG. 5B, a first curve 61 may represent the reflectivity of a substrate where no patterned structure and no trenches are formed. A second curve 62 may represent the reflectivity of a substrate such as the substrate 40 illustrated in FIG. 4B, where a patterned structure is formed using KOH as etching solution prior to the formation of trenches. A third curve 63 may represent the reflectivity of a substrate such as the substrate 40 illustrated in FIG. 4C, where a patterned structure is formed using the KOH solution and then a plurality of trenches are formed based on an ECE process using 2M HF as etching solution under application of an electrical current having a current density of approximately 1 mA/cm$^2$ for an hour. A fourth curve 54 may represent the reflectivity of a substrate where a patterned structure is formed using the KOH solution and then a plurality of trenches are formed based on an ECE process using 2M HF as etching solution under application of an electrical current having a current density of approximately 5 mA/cm$^2$ for an hour. The experimental results may reveal that the reflectivity of a substrate may be decreased if a patterned structure is formed. Furthermore, the reflectivity of a substrate having a patterned structure may range from approximately 5% to 17% given an incident light having a wavelength of approximately 400 nm to 800 nm.

Figure 6B:
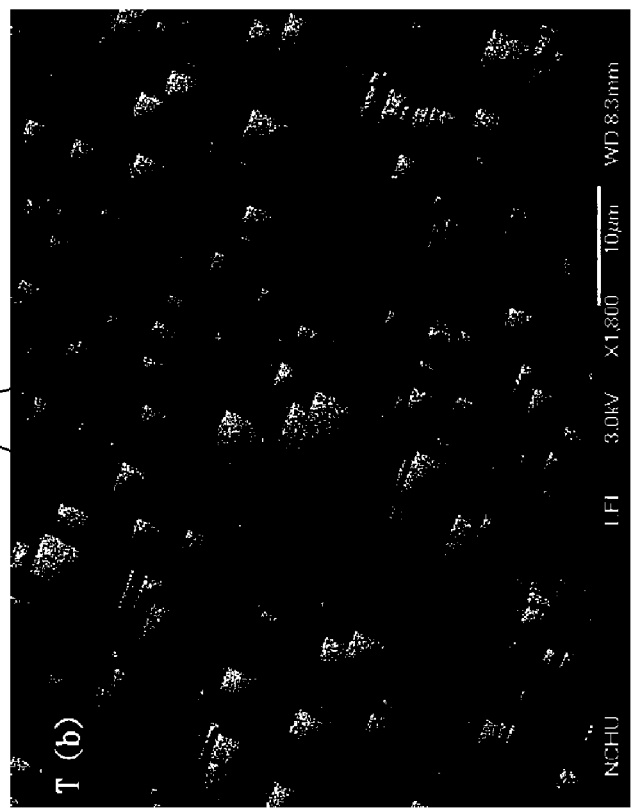
FIGS. 6A and 6B are exemplary SEM photos showing respectively a cross-sectional view and a top planar view of a textured structure formed by a method consistent with an example of the present invention before trenches are formed.
Figure 6A:
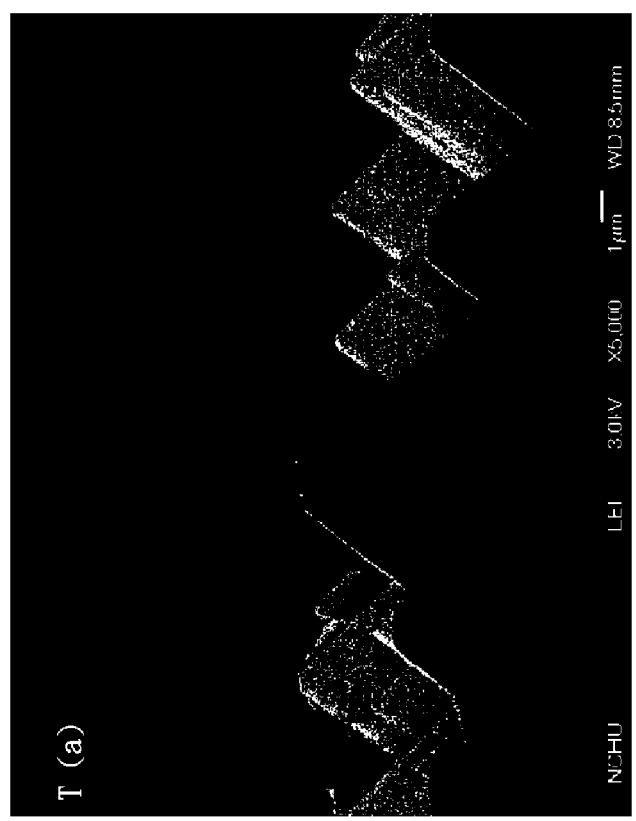

FIGS. 6A and 6B are exemplary SEM photos showing respectively a cross-sectional view and a top planar view of a textured structure 61 formed by a method consistent with an example of the present invention before trenches are formed. Referring to FIGS. 6A and 6B, the textured structure 61 may include a plurality of pyramids 62. Each of the pyramids 62 may contact its adjacent pyramids at interface portions 62-1.

Figure 6D:
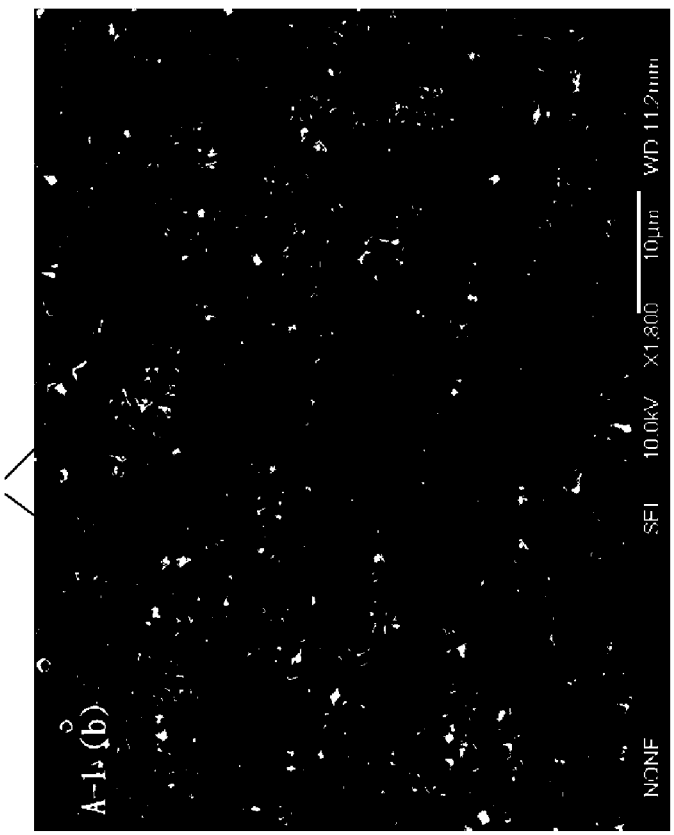
FIGS. 6C and 6D are exemplary SEM photos showing respectively a cross-sectional view and a top planar view of a textured structure formed by a method consistent with an example of the present invention after trenches are formed.
Figure 6C:
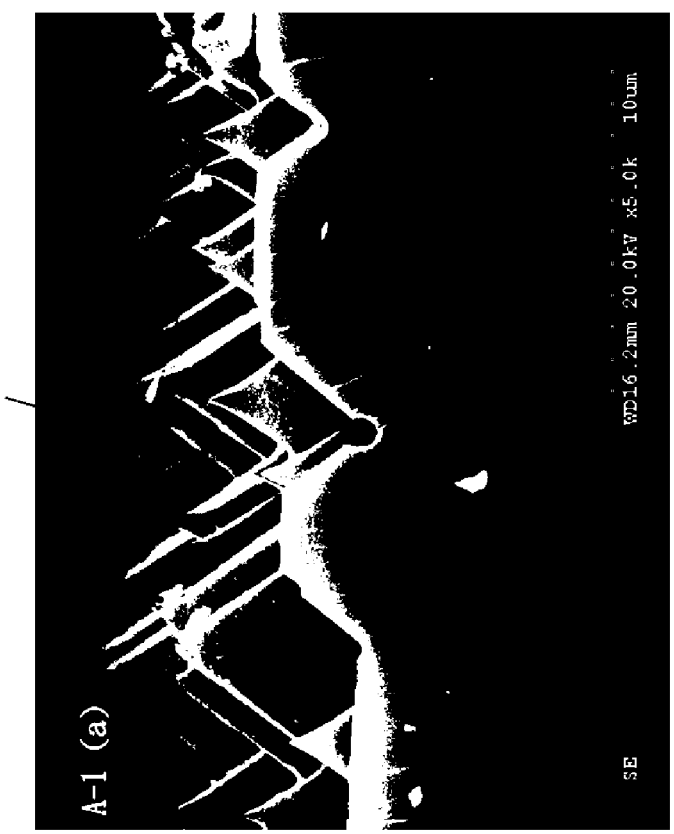

FIGS. 6C and 6D are exemplary SEM photos showing respectively a cross-sectional view and a top planar view of a textured structure 63 formed by a method consistent with an example of the present invention after trenches 64 are formed. Referring to FIGS. 6C and 6D, each the trenches 64 may be formed at interface portions (not numbered) of adjacent pyramids 65 or between at least two adjacent pyramids 65.

Figure 7:
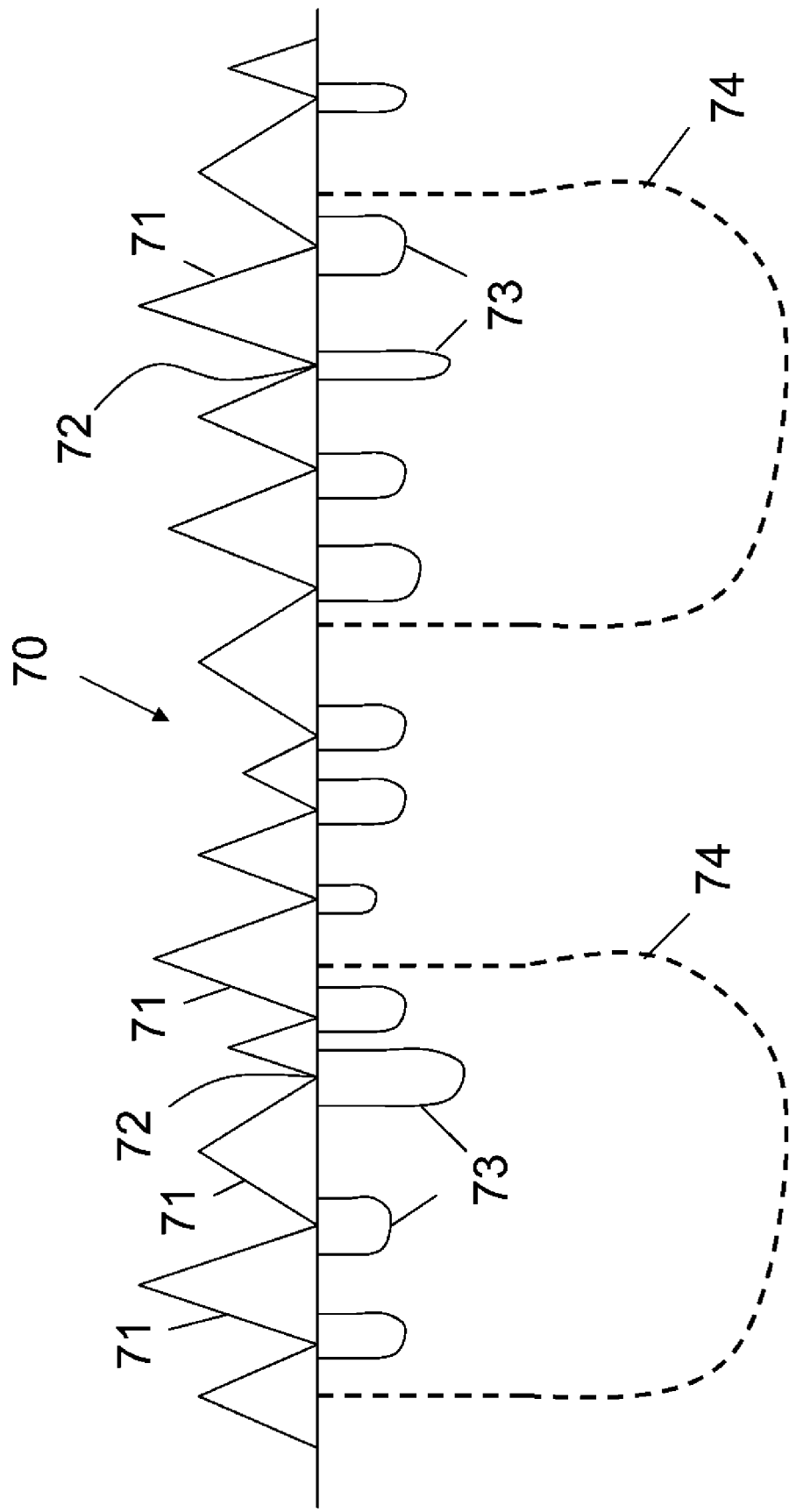
FIG. 7 is a schematic cross-sectional diagram showing trenches formed into a textured structures consistent with an example of the present invention.

FIG. 7 is a schematic cross-sectional diagram showing trenches 73 formed into a textured structure 70 consistent with an example of the present invention. Referring to FIG. 7, the textured structure 70 may include a plurality of pyramids 71, each of which may contact its adjacent pyramids at interface portions 72. The trenches 73 may be formed into the textured structure 70 from the interface portions 72. In one example according to the present invention, each of the trenches 73 may correspond to one of the interface portions 72.

By comparison, in a conventional method, trenches 74 (illustrated in dotted lines) may formed into a textured structure (not numbered) in a predetermined pattern or at a predetermined distance from each other. Furthermore, each of the trenches 74 in width may span across a number of trenches 74.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A method of manufacturing a semiconductor photovoltaic device, the method comprising:
   providing a semiconductor substrate having a first surface and a second surface, the first surface and the second surface being opposed to each other;
   etching the semiconductor substrate to form a plurality of trenches into the semiconductor substrate;
   forming a heavily doped region in the semiconductor substrate along the first surface and the plurality of trenches;
   adding a first conductive layer over the heavily doped region, the first conductive layer being formed of a material different from a material of the semiconductor substrate and covering at least one side wall of at least one of the plurality of trenches and at least a portion of the first surface outside the trenches; and
   adding a second conductive layer on the second surface of the semiconductor substrate.

2. The method of claim 1 further comprising etching the semiconductor substrate by an electrochemical etching (ECE) process.

3. The method of claim 2, wherein the ECE process includes using an acid selected from one of hydrogen fluoride (HF), dimethylformamide (DMF), a mixture of HF and deionized water ($H_2O$), a mixture of DMF and $H_2O$, a mixture of HF and ethanol, or a mixture of HF, DMF, and $H_2O$.

4. The method of claim 1, wherein the semiconductor substrate comprises a first type of impurities, the heavily doped region comprises a second type of impurities, and the first type of impurities is different from the second type of impurities.

5. The method of claim 1 further comprising forming an anti-reflection layer over the semiconductor substrate.

* * * * *